(12) United States Patent
Antonenkov

(10) Patent No.: US 8,617,919 B2
(45) Date of Patent: Dec. 31, 2013

(54) ORGANIC LIGHT EMITTING DIODE DISPLAY AND MANUFACTURING METHOD THEREOF

(71) Applicant: Samsung Display Co., Ltd., Yongin-si (KR)

(72) Inventor: Dmitry Antonenkov, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/652,002

(22) Filed: Oct. 15, 2012

(65) Prior Publication Data

US 2013/0277645 A1 Oct. 24, 2013

(30) Foreign Application Priority Data

Apr. 24, 2012 (KR) .................. 10-2012-0042652

(51) Int. Cl.
*H01L 51/40* (2006.01)
(52) U.S. Cl.
USPC .................. 438/99; 257/40; 257/E51.001
(58) Field of Classification Search
USPC ............................................ 257/40, E51.001
See application file for complete search history.

(56) References Cited

U.S. PATENT DOCUMENTS

| 5,294,869 A | 3/1994 | Tang et al. |
| 6,791,258 B2 | 9/2004 | Haase et al. |
| 7,542,199 B1 | 6/2009 | Mayer et al. |
| 8,125,142 B2 * | 2/2012 | Sung et al. .................. 313/504 |
| 2006/0032586 A1 | 2/2006 | Choi et al. |
| 2009/0155466 A1 | 6/2009 | Tang |
| 2012/0025226 A1 | 2/2012 | Oda |

FOREIGN PATENT DOCUMENTS

KR 1998-061775 11/1998

OTHER PUBLICATIONS

Jackman, et al, *Using Elastomeric Membranes as Dry Resists and for Dry Lift-Off*, Langmuir, vol. 15, Mar. 19, 1999, pp. 2973-2984, XP-002700107.
EPO Search Report dated Aug. 9, 2013, for corresponding European Patent application 13164800.8, (10 pages).

* cited by examiner

*Primary Examiner* — Anthony Ho
(74) *Attorney, Agent, or Firm* — Christie, Parker & Hale, LLP

(57) ABSTRACT

A manufacturing method of an organic light emitting diode (OLED) display according to an exemplary embodiment includes: forming a thin film transistor panel; forming a deposition mask on the thin film transistor panel by a photolithography process; obliquely spraying an organic material to the deposition mask from a linear deposition source to form an organic emission layer on the thin film transistor panel; and removing the deposition mask by using an adhering film, wherein the deposition mask includes a plurality of deposition walls configured to block the organic material sprayed at an angle that is less than a blocking angle. Accordingly, the deposition mask is formed by the photolithography process such that alignment of the deposition mask is straightforward when manufacturing the organic light emitting diode (OLED) display of a large size.

9 Claims, 18 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2012-0042652 filed in the Korean Intellectual Property Office on Apr. 24, 2012, the entire content of which is incorporated herein by reference.

BACKGROUND

1. Field

The described technology relates generally to an organic light emitting diode (OLED) display and a manufacturing method thereof.

2. Description of the Related Art

An organic light emitting diode (OLED) display includes organic light emitting diodes each including two electrodes and an organic emission layer disposed therebetween, and electrons injected from one electrode and holes injected from the other electrode are combined in the organic emission layer such that excitons are formed, and light is emitted by the energy generated from the excitons.

To form the organic emission layer, an organic material is deposited on a thin film transistor panel, and to achieve this, a deposition source filled with the organic material is heated to evaporate the organic material. Then, the evaporated organic material is sprayed over the thin film transistor panel. In this case, to deposit the evaporated and sprayed organic material in a pixel area, a deposition mask is used. The deposition mask includes an opening for transmitting the organic material and a blocking portion made of a metal for blocking the organic material.

However, as the size of the organic light emitting diode (OLED) display is increased, it is difficult to align the deposition mask made of the metal with the thin film transistor panel. To solve this problem, a method of obliquely spraying the organic material to the deposition mask from the deposition source has been developed. However, in this case, to compensate for a parallax, a distance between the deposition source and the thin film transistor panel is more than several times the size of the thin film transistor panel. When the size of the thin film transistor panel is several meters or larger, it is difficult to realize this deposition method.

The above information disclosed in this Background section is only for enhancement of understanding of the background of the described technology, and it may contain information that does not form the prior art that is already known in this country to a person of ordinary skill in the art.

SUMMARY

Embodiments of the present invention relate generally to an organic light emitting diode (OLED) display using a deposition mask capable of being applied to a large size organic light emitting diode (OLED) display and being easily aligned, and a manufacturing method thereof.

An organic light emitting diode (OLED) display according to an exemplary embodiment includes: a thin film transistor panel including a plurality of thin film transistors; a first color organic emission layer and a second color organic emission layer formed to be separated from each other on the thin film transistor panel; and a third color organic emission layer covering the thin film transistor panel, the first color organic emission layer, and the second color organic emission layer, wherein overlapping portions of the first color organic emission layer and the third color organic emission layer correspond to a first subpixel, overlapping portions of the second color organic emission layer and the third color organic emission layer correspond to a second subpixel, and a portion of the third color organic emission layer located between the first color organic emission layer and the second color organic emission layer corresponds to a third subpixel.

The first subpixel, the second subpixel, and the third subpixel may form a quadrangular pixel.

The first color organic emission layer may include a red organic emission layer, the second color organic emission layer may include a green organic emission layer, and the third color organic emission layer may include a blue organic emission layer.

Also, an organic light emitting diode (OLED) display according to another exemplary embodiment includes: a thin film transistor panel including a plurality of thin film transistors; and a first color organic emission layer, a second color organic emission layer, and a third color organic emission layer adjacent to each other and each having a rhombus shape on the thin film transistor panel, wherein the first color organic emission layer, the second color organic emission layer, and the third color organic emission layer respectively correspond to a first subpixel, a second subpixel, and a third subpixel, and the first subpixel, the second subpixel, and the third subpixel form a hexahedral pixel.

A plurality of the hexahedral pixels may be separated from each other and may be arranged in a honeycomb shape.

The first color organic emission layer may include a red organic emission layer, the second color organic emission layer may include a green organic emission layer, and the third color organic emission layer may include a blue organic emission layer.

Also, a manufacturing method of an organic light emitting diode (OLED) display according to an exemplary embodiment includes: forming a thin film transistor panel; forming a deposition mask on the thin film transistor panel by a photolithography process; obliquely spraying an organic material to the deposition mask from a linear deposition source to form an organic emission layer on the thin film transistor panel; and removing the deposition mask by using an adhering film, wherein the deposition mask includes a plurality of deposition walls configured to block the organic material sprayed at an angle that is less than a blocking angle.

The deposition mask may include a parallel deposition wall including two deposition walls that are separated from each other and are substantially parallel to each other.

When a distance between the deposition walls is referred to as Wp, the blocking angle at which the organic material is blocked by the deposition wall is referred to as $\alpha$, and a deposition length at which the organic material is deposited in the parallel deposition wall is referred to as Wsp, a height h of the deposition wall may be defined as follows: $h=(W_p-W_{sp})\times\tan\alpha$.

The forming of the organic emission layer may include: spraying a first organic material in a first direction to form a first color organic emission layer in the parallel deposition wall; spraying a second organic material in a second direction that is 180 degrees from the first direction, to form a second color organic emission layer in the parallel deposition wall; and spraying a third organic material in a third direction substantially in parallel to a height direction of the deposition wall to form a third color organic emission layer in the parallel deposition wall.

The second color organic emission layer may be separated from the first color organic emission layer.

The deposition mask may include a hexahedral deposition wall forming a hexahedral shape of which six deposition walls are connected to each other.

When a length of the deposition wall is referred to as a and the blocking angle at which the organic material is blocked by the deposition wall is referred to as α, the height h of the deposition wall may be defined by h=a×tan α.

The forming of the organic emission layer may include: spraying a first organic material in a first hexahedral direction to form a first color organic emission layer of a rhombus shape in the hexahedral deposition wall; spraying a second organic material in a second hexahedral direction that is 120 degrees from the first hexahedral direction to form a second color organic emission layer of the rhombus shape in the hexahedral deposition wall; and spraying a third organic material in a third hexahedral direction that is 120 degrees from the second hexahedral to form a third color organic emission layer of the rhombus shape in the hexahedral deposition wall.

One direction of the first hexahedral direction, the second hexahedral direction, and the third hexahedral direction may be substantially parallel to a direction at which facing edges of the hexahedral deposition wall are connected to each other.

According to exemplary embodiments, the deposition mask is formed by the photolithography process such that the alignment of the deposition mask is straightforward when manufacturing the organic light emitting diode (OLED) display of a large size.

Also, when forming the organic emission layer by using the deposition mask including the hexahedral deposition wall, the blue organic emission layer does not overlap the red organic emission layer and green organic emission layer such that the visibility and the transmittance are improved.

DETAILED DESCRIPTION

Figure 1:
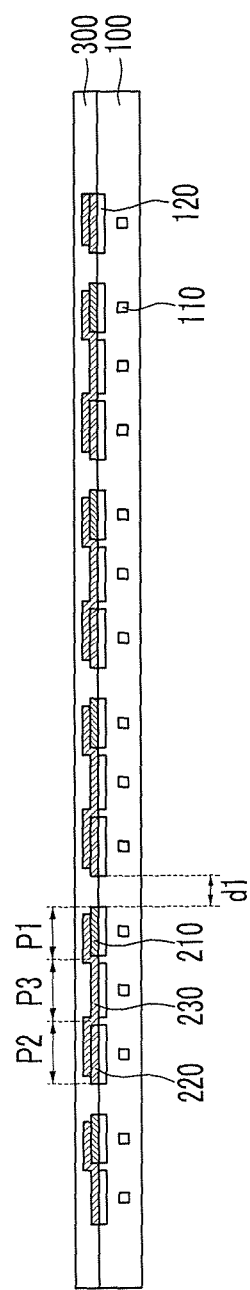
FIG. 1 is a cross-sectional view of an organic light emitting diode (OLED) display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In order to clarify layers and regions, thicknesses and sizes thereof are exemplarily illustrated, and thus the present invention is not limited thereto.

Now, an organic light emitting diode (OLED) display according to a first exemplary embodiment will be described with reference to FIG. 1 and FIG. 2.

Figure 2:
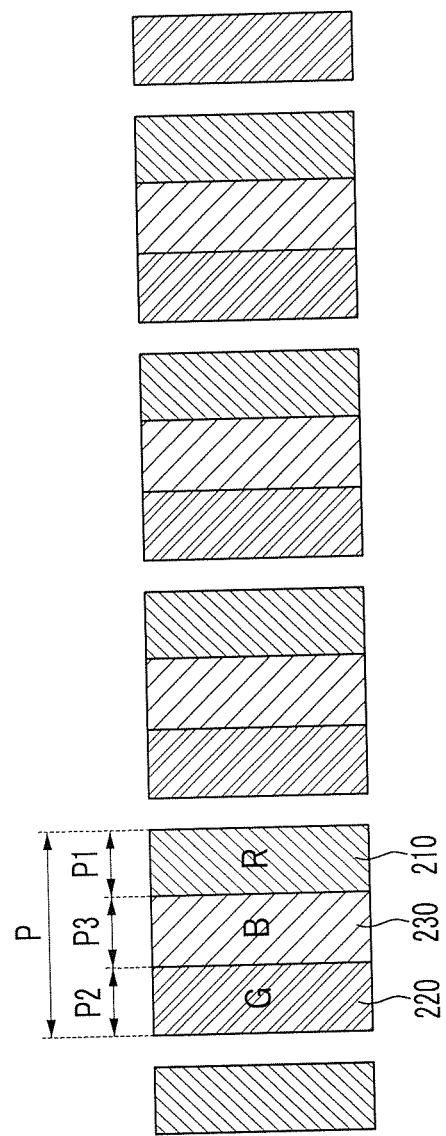
FIG. 2 is a top plan view of the organic light emitting diode (OLED) display according to the first exemplary embodiment.

FIG. 1 is a cross-sectional view of an organic light emitting diode (OLED) display according to the first exemplary embodiment, and FIG. 2 is a top plan view of the organic light emitting diode (OLED) display according to the first exemplary embodiment.

As shown in FIG. 1 and FIG. 2, the organic light emitting diode (OLED) display according to the first exemplary embodiment includes a thin film transistor panel 100 including a plurality of thin film transistors 110, a first color organic emission layer 210 and a second color organic emission layer 220 separated from each other on the thin film transistor panel 100, and a third color organic emission layer 230 covering the thin film transistor panel 100, the first color organic emission layer 210, and the second color organic emission layer 220.

The thin film transistor panel 100 includes a plurality of gate lines for transmitting a scan signal, a plurality of data lines for transmitting a data signal, and a plurality of driving voltage lines for transmitting a driving voltage. The plurality of thin film transistors 110 are connected to the gate lines, the data lines, and the voltage lines. The plurality of thin film transistors 110 include a switching thin film transistor and a driving thin film transistor coupled to a storage capacitor, and an anode 120 of an organic light emitting diode is connected to an output terminal of the driving thin film transistor.

The switching thin film transistor transmits the data signal applied to the data line to the driving thin film transistor in response to the scan signal applied to the gate line, and the driving thin film transistor supplies an output current having a magnitude that is changed according to a voltage difference between the control terminal and the output terminal of the driving thin film transistor.

A cathode 300 connected to a common voltage (Vss) is formed on the third color organic emission layer 230. The anode 120, the organic emission layers 210, 220, and 230, and the cathode 300 form a number of organic light emitting diodes (OLED) such that each of the organic light emitting diodes (OLEDs) emits light having an intensity depending on an output current ILD of the driving transistor (Qd), thereby displaying images.

The first color organic emission layer 210 and the third color organic emission layer 230 are deposited, thereby corresponding to a first subpixel P1. The second color organic emission layer 220 and the third color organic emission layer 230 are deposited, thereby corresponding to a second subpixel P2. The third color organic emission layer 230 formed between the first color organic emission layer 210 and the second color organic emission layer 220 corresponds to a third subpixel P3. Also, the first subpixel P1, the second subpixel P2, and the third subpixel P3 form one quadrangular pixel (P), and neighboring quadrangular pixels (P) are disposed to be separated by a set or predetermined distance. A region d1 between the neighboring quadrangular pixels (P) is a region where a deposition mask 400 (shown in FIG. 3) was previously formed.

The first color organic emission layer 210 may be a red organic emission layer, the second color organic emission layer 220 may be a green organic emission layer, and the third color organic emission layer 230 may be a blue organic emission layer. Accordingly, the first subpixel P1 emits a red (R) color, the second subpixel P2 emits a green (G) color, and the third subpixel P3 emits a blue (B) color. This is because visibility of the red color is much better than the blue color in the first subpixel P1 where the red organic emission layer 210 and the blue organic emission layer 230 are deposited, and the visibility of the green color is much better than the blue color in the second subpixel P2 where the green organic emission layer 220 and the blue organic emission layer 230 are deposited.

Next, a manufacturing method of the organic light emitting diode (OLED) display according to the first exemplary embodiment will be described with reference to FIG. 3 to FIG. 11.

Figure 3:
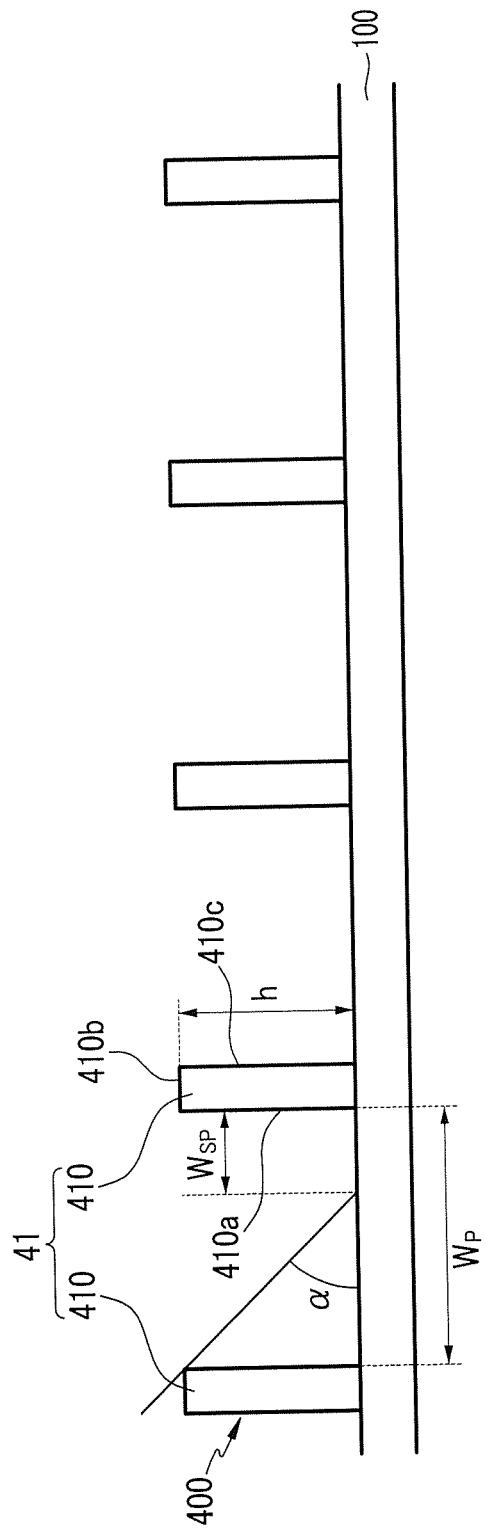
FIG. 3 is a view showing a step of forming a deposition mask as one step of a manufacturing method of an organic light emitting diode (OLED) display according to the first exemplary embodiment.
Figure 4:
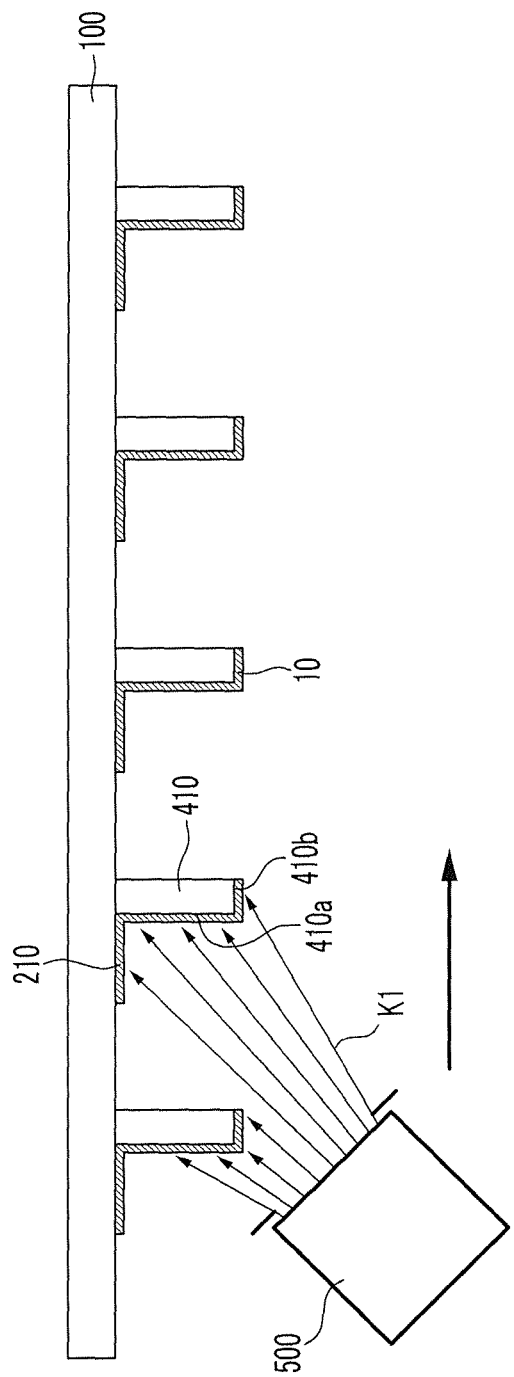
FIG. 4 is a view showing a step of spraying a first organic material as a following step of FIG. 3.
Figure 5:
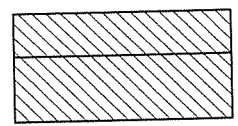
FIG. 5 is a deposition plan view of the first organic material deposited in FIG. 4.
Figure 5:
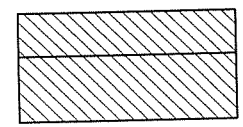
Figure 5:
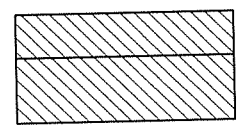
Figure 5:
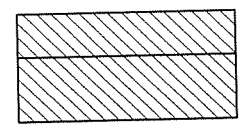
Figure 5:
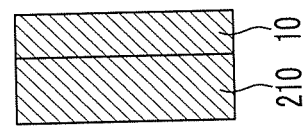
Figure 6:
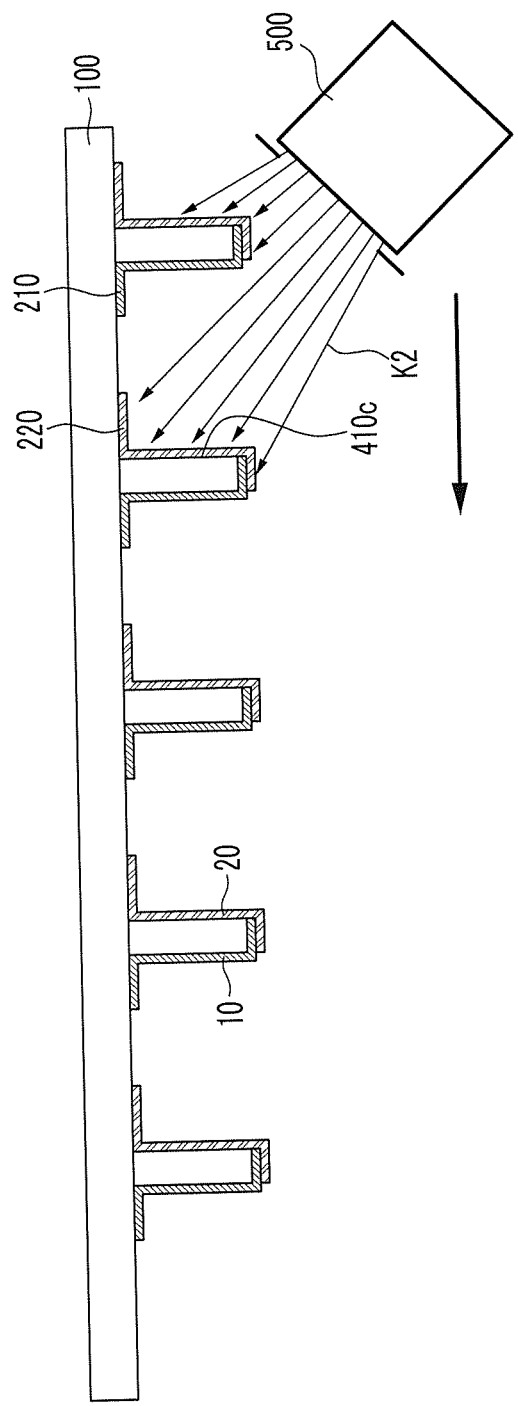
FIG. 6 is a view showing a step of spraying a second organic material as a following step of FIG. 4.
Figure 7:
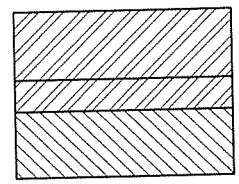
FIG. 7 is a deposition plan view of the second organic material deposited in FIG. 6.
Figure 7:
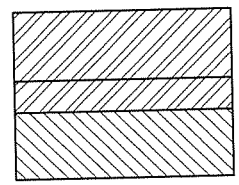
Figure 7:
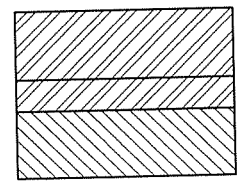
Figure 7:
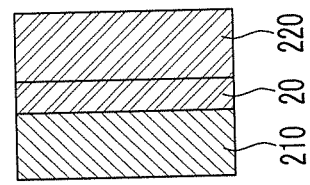
Figure 7:
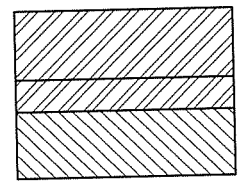
Figure 8:
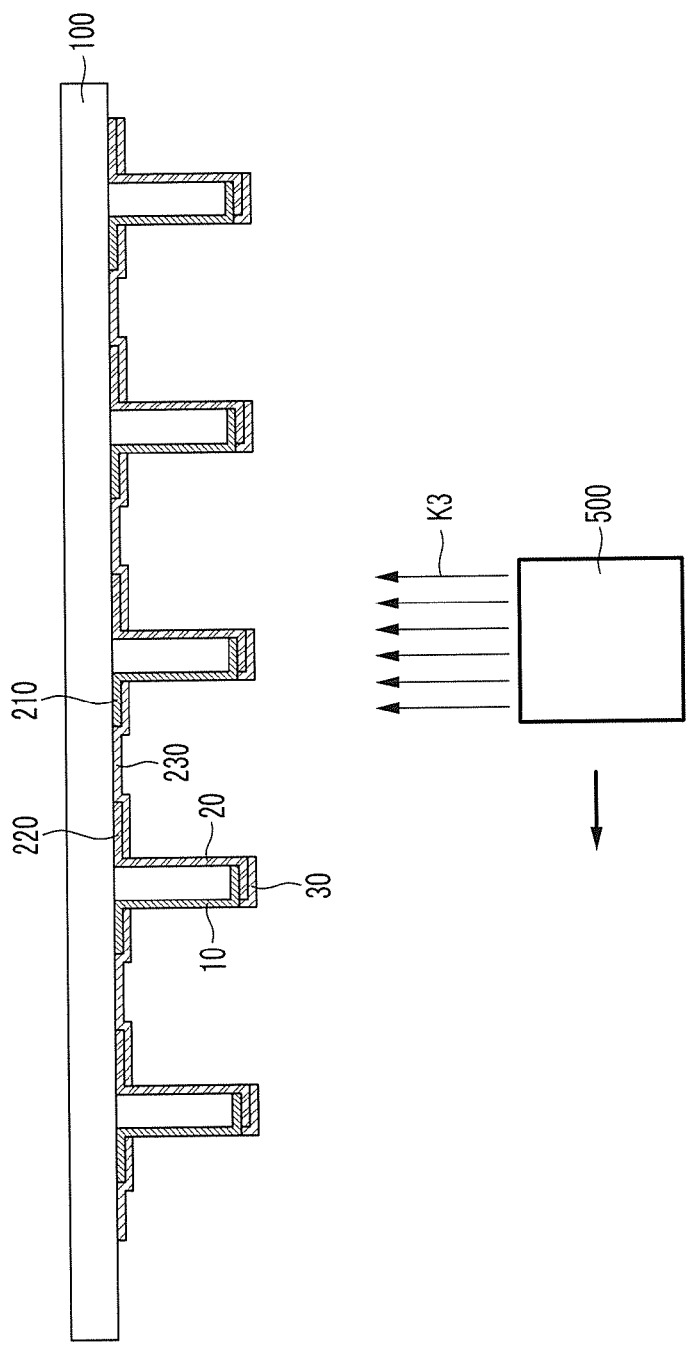
FIG. 8 is a view showing a step of spraying a third organic material as a following step of FIG. 6.
Figure 9:
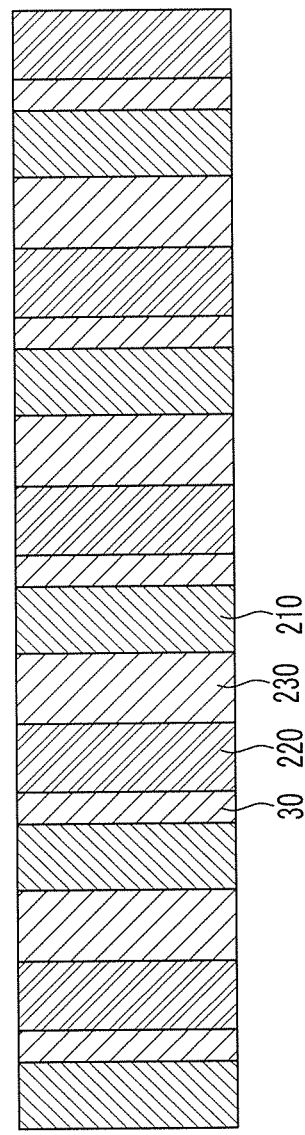
FIG. 9 is a deposition plan view of the third organic material deposited in FIG. 8.
Figure 10:
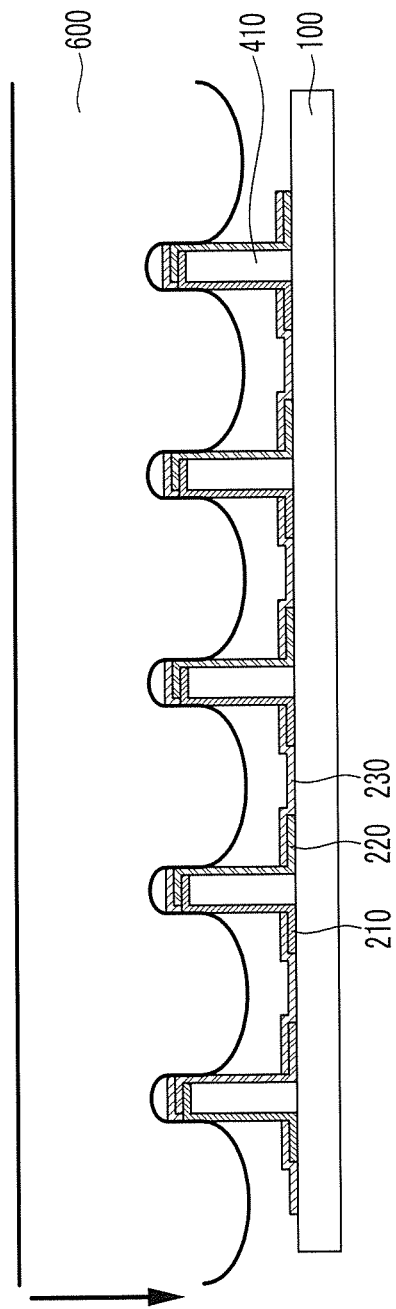
FIG. 10 is a view showing a step of attaching an adhering film to a deposition mask as a following step of FIG. 8.
Figure 11:
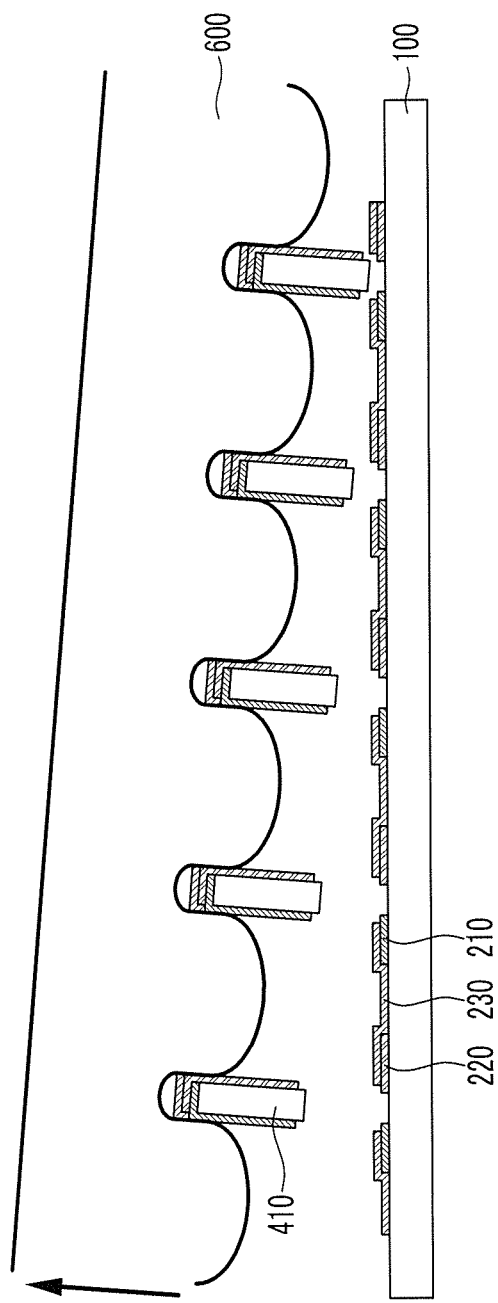
FIG. 11 is a view showing a step of separating the deposition mask from a thin film transistor panel by using the adhering film as a following step of FIG. 10.

FIG. 3 is a view showing a step of forming a deposition mask as one step of a manufacturing method of an organic light emitting diode (OLED) display according to the first exemplary embodiment, FIG. 4 is a view showing a step of spraying a first organic material as a following step of FIG. 3, FIG. 5 is a deposition plan view of the first organic material deposited in FIG. 4, FIG. 6 is a view showing a step of spraying a second organic material as a following step of FIG. 4, FIG. 7 is a deposition plan view of the second organic material deposited in FIG. 6, FIG. 8 is a view showing a step of spraying a third organic material as a following step of FIG. 6, FIG. 9 is a deposition plan view of the third organic material deposited in FIG. 8, FIG. 10 is a view showing a step of adhering an adhering film to a deposition mask as a following step of FIG. 8, and FIG. 11 is a view showing a step of separating a deposition mask from a thin film transistor panel by using the adhering film as a following step of FIG. 10.

As shown in FIG. 3, in the manufacturing method of the organic light emitting diode (OLED) display according to the first exemplary embodiment, a thin film transistor panel 100 is firstly formed. Also, a deposition mask 400 is formed by, for example, a photolithography process on the thin film transistor panel 100.

The deposition mask 400 includes a plurality of deposition walls 410 configured to block organic materials 10, 20, and 30 that are sprayed at an angle of less than a blocking angle ($\alpha$), and two deposition walls 410 are separated to be parallel to each other, thereby forming a parallel deposition wall 41 (or cavity). The deposition wall 410 includes an upper surface 410b, and a first wall 410a and a second wall 410c extending from the upper surface 410b downward.

Here, when a distance between the deposition walls 410 is referred to as Wp, the blocking angle at which the organic materials 10, 20, and 30 are blocked by the deposition wall 410 is referred to as $\alpha$, and a deposition length at which the organic materials 10, 20, and 30 are deposited in the parallel deposition wall 41 is referred to as Wsp. A height h of the deposition wall 410 is defined by Equation 1 below.

$$h=(W_p-W_{sp})\times\tan\alpha \qquad \text{Equation 1}$$

Next, as shown in FIG. 4 and FIG. 5, the first organic material 10 is obliquely sprayed to the deposition mask 400 from a linear deposition source 500 to form the first color organic emission layer 210 on the thin film transistor panel 100. Here, the linear deposition source 500 is obliquely positioned such that the blocking angle ($\alpha$) is formed between the spray direction of the first organic material 10 sprayed from the linear deposition source 500 and the surface of the thin film transistor panel 100. Next, the first organic material 10 is sprayed while the thin film transistor panel 100 is fixed, and the linear deposition source 500 is moved in the horizontal direction, or the first organic material 10 is sprayed while the linear deposition source 500 is fixed and the thin film transistor panel 100 is moved in the horizontal direction.

In FIG. 4, the first organic material 10 is sprayed in the first direction k1 as a spray direction of the first organic material 10 to form the first color organic emission layer 210 in the parallel deposition wall 41. Here, the first organic material 10 is deposited at the first wall 410a of the deposition wall 410 oppositely facing the first direction k1, the upper surface 410b of the deposition wall 410, and the first subpixel P1 on the thin film transistor panel 100 adjacent to the first wall 410a. The first organic material 10 deposited at the first subpixel P1 adjacent to the first wall 410a becomes the first color organic emission layer 210.

Next, as shown in FIG. 6 and FIG. 7, the second organic material 20 is sprayed in a second direction k2 to form the second color organic emission layer 220 in the parallel deposition wall 41, and the second direction k2 is about 180 degrees from the first direction k1. In one embodiment, the second organic material 20 is sprayed while the thin film transistor panel 100 is fixed, and the linear deposition source 500 is moved in the horizontal direction. In another embodiment, while the linear deposition source 500 is fixed, the thin film transistor panel 100 is moved in the horizontal direction.

Here, the second organic material 20 is deposited at the upper surface 410b of the deposition wall 410, the second wall 410c of the deposition wall 410 oppositely facing the second direction k2, and the second subpixel P2 on the thin film transistor panel 100 adjacent to the second wall 410c. The second organic material 20 deposited at the second subpixel P2 adjacent to the second wall 410c becomes the second color organic emission layer 220. Therefore, the second color organic emission layer 220 is formed to be separated from the first color organic emission layer 210 by the deposition wall 410.

Next, as shown in FIG. 8 and FIG. 9, the third organic material 30 is sprayed in a third direction k3 parallel to a height direction of the deposition wall 410 to form the third color organic emission layer 230 in the parallel deposition wall 41. In one embodiment, the third organic material 30 is sprayed while the thin film transistor panel 100 is fixed, and the linear deposition source 500 is moved in the horizontal direction. In another embodiment, while the linear deposition source 500 is fixed, the thin film transistor panel 100 is moved in the horizontal direction.

Here, the third organic material 30 is deposited at the upper surface 410b of the deposition wall 410, the first subpixel P1, the second subpixel P2, and the third subpixel P3 on the thin film transistor panel 100. The third organic material 30 deposited between the first subpixel P1 and the second subpixel P2 becomes the third color organic emission layer 230.

Next, as shown in FIG. 10, an adhering film 600 is adhered to an upper portion of the deposition mask 400. Also, as shown in FIG. 11, the adhering film 600 is detached upward to concurrently (e.g., simultaneously) separate the deposition mask 400 from the thin film transistor panel 100. This is because the deposition mask 400 is adhered to the adhering film 600 by the adhesion of the adhering film 600.

Referring back to FIG. 1, the cathode 300 is formed on the third color organic emission layer 230, thereby completing the quadrangular pixel (P). As described above, the deposition mask is formed by the photolithography process such that alignment of the deposition mask is straightforward when manufacturing the organic light emitting diode (OLED) display of a large size.

Here, in the first exemplary embodiment, the quadrangular pixel is formed by using the parallel deposition wall. However, in a second exemplary embodiment, a hexahedral pixel may be formed by using a hexahedral deposition wall.

Next, an organic light emitting diode (OLED) display according to the second exemplary embodiment will be described with reference to FIG. 12.

Figure 12:
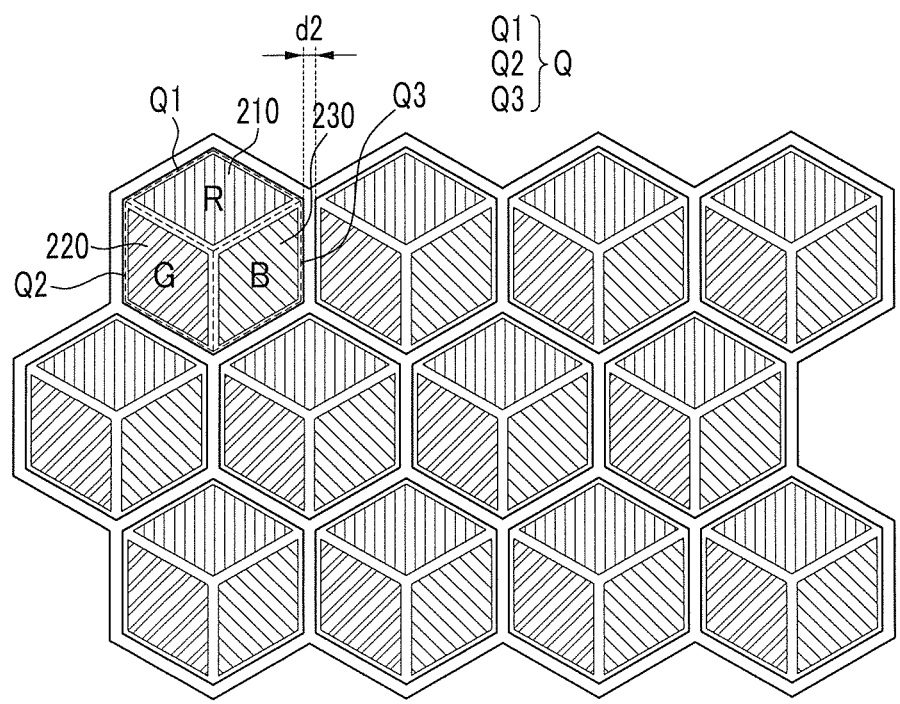
FIG. 12 is a top plan view of an organic light emitting diode (OLED) display according to a second exemplary embodiment.

FIG. 12 is a top plan view of an organic light emitting diode (OLED) display according to the second exemplary embodiment.

The second exemplary embodiment shown in FIG. 12 is substantially equivalent to the first exemplary embodiment shown in FIG. 1 and FIG. 2 except for the hexahedral pixel such that the repeated description is omitted.

As shown in FIG. 12, the organic light emitting diode (OLED) display according to the second exemplary embodiment includes a thin film transistor panel 100 (shown in FIG. 13) including a plurality of thin film transistors, and a first color organic emission layer 210, a second color organic emission layer 220, and a third color organic emission layer 230 adjacent to each other on the thin film transistor panel 100. Each of the first, second, and third color organic emission layers 210, 220, and 230 having a rhombus shape.

The first color organic emission layer 210, the second color organic emission layer 220, and the third color organic emission layer 230 respectively correspond to a first subpixel Q1, a second subpixel Q2, and a third subpixel Q3. Also, the first subpixel Q1, the second subpixel Q2, and the third subpixel Q3 form one hexahedral pixel (Q), and adjacent hexahedral pixels (Q) are separated by a set or predetermined distance, thereby forming a honeycomb shape. A region d2 between the adjacent hexahedral pixels (Q) is a region where a deposition mask 400 was previously formed.

In one embodiment, the first color organic emission layer 210 may be the red organic emission layer, the second color organic emission layer 220 may be the green organic emission layer, and the third color organic emission layer 230 may be the blue organic emission layer. Accordingly, the first subpixel Q1 emits the red (R) color light, the second subpixel Q2 emits the green (G) color light, and the third subpixel Q3 emits the blue (B) color light. In this case, differently from the first exemplary embodiment, the blue organic emission layer 230 does not overlap the red organic emission layer 210 and the green organic emission layer 220 such that the visibility and the transmittance are improved.

Next, the manufacturing method of the organic light emitting diode (OLED) display according to the second exemplary embodiment will be described with reference to FIG. 13 to FIG. 18.

Figure 13:
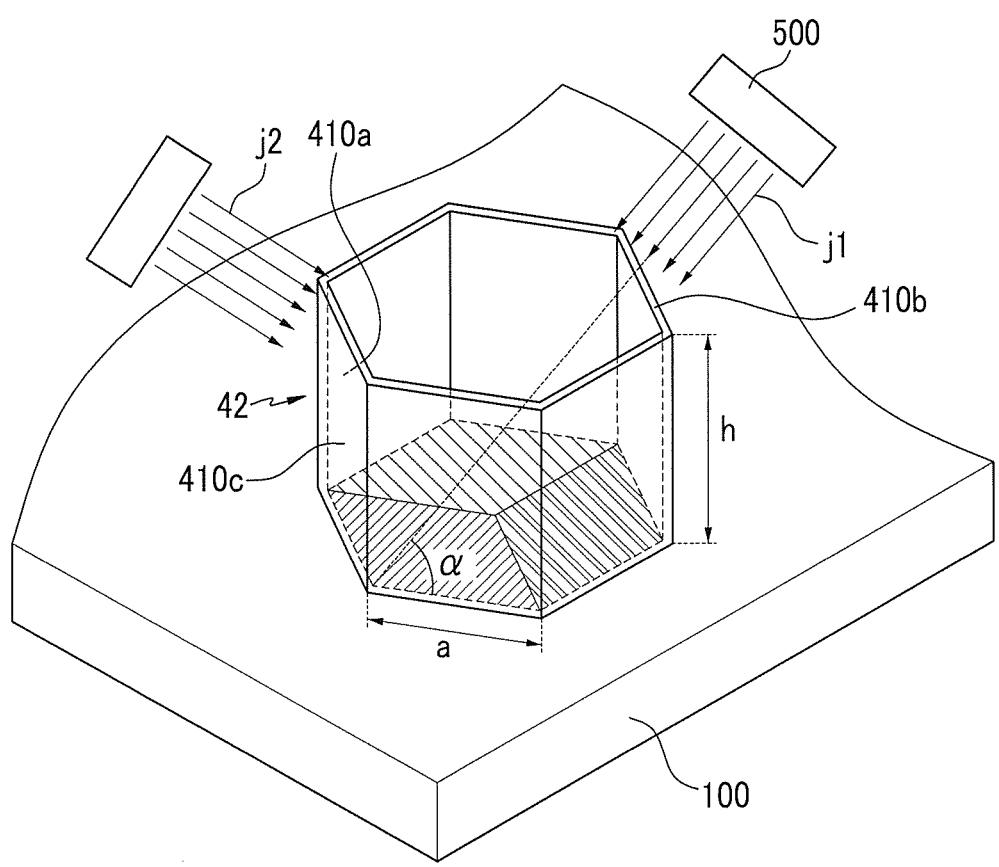
FIG. 13 is a perspective view showing a state of spraying an organic material to a deposition mask in a manufacturing method of an organic light emitting diode (OLED) display according to the second exemplary embodiment.
Figure 14:
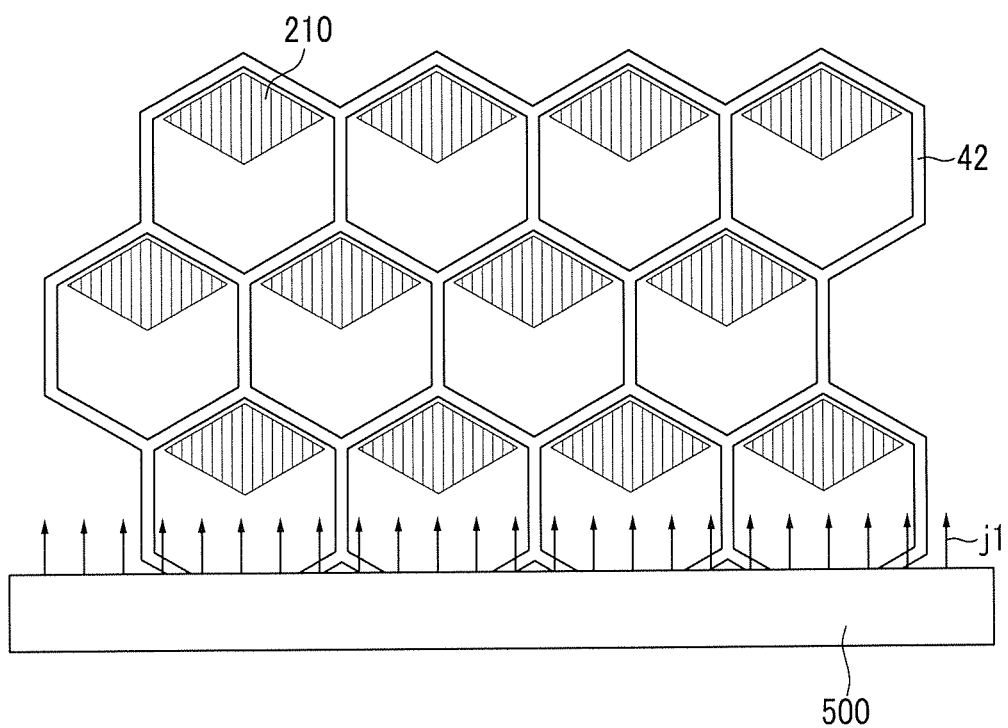
FIG. 14 is a view showing a step of spraying the first organic material in a manufacturing method of an organic light emitting diode (OLED) display according to the second exemplary embodiment.
Figure 15:
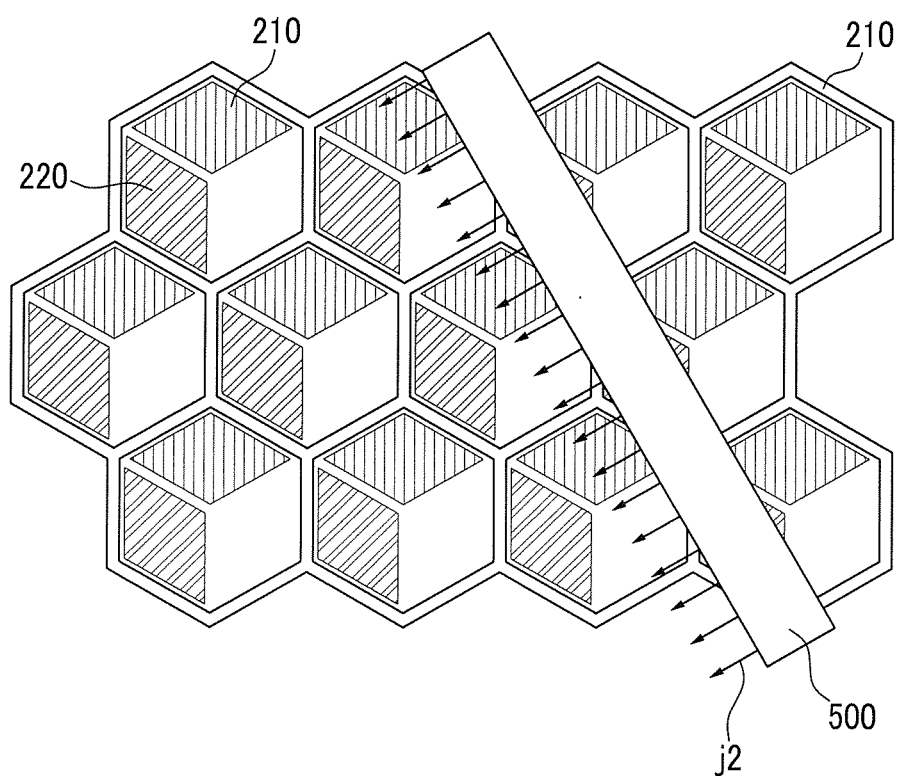
FIG. 15 is a view showing a step of spraying the second organic material as a following step of FIG. 14.
Figure 16:
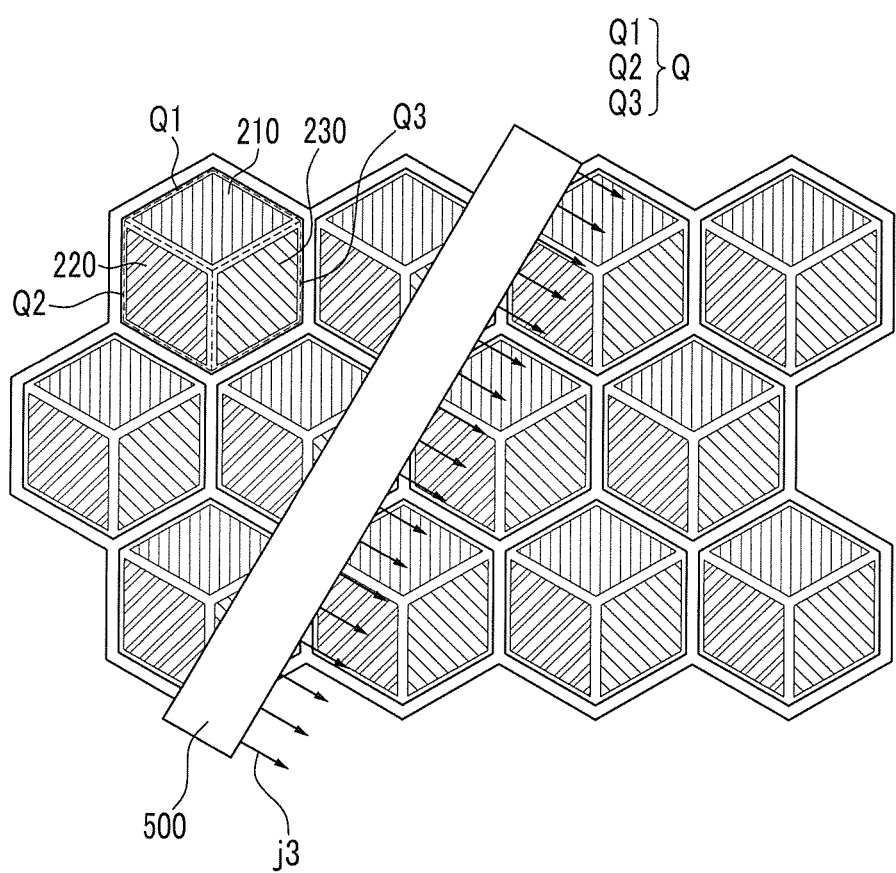
FIG. 16 is a view showing a step of spraying the third organic material as a following step of FIG. 15.
Figure 17:
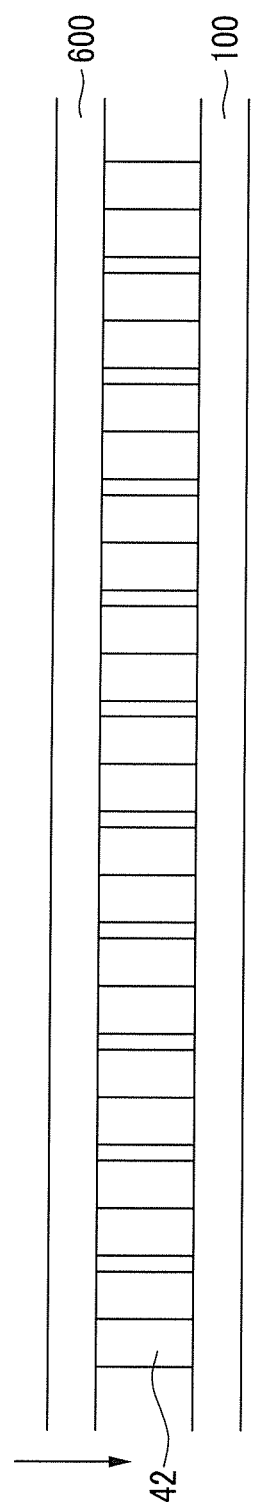
FIG. 17 is a view showing a step of attaching an adhering film to a deposition mask as a following step of FIG. 16.
Figure 18:
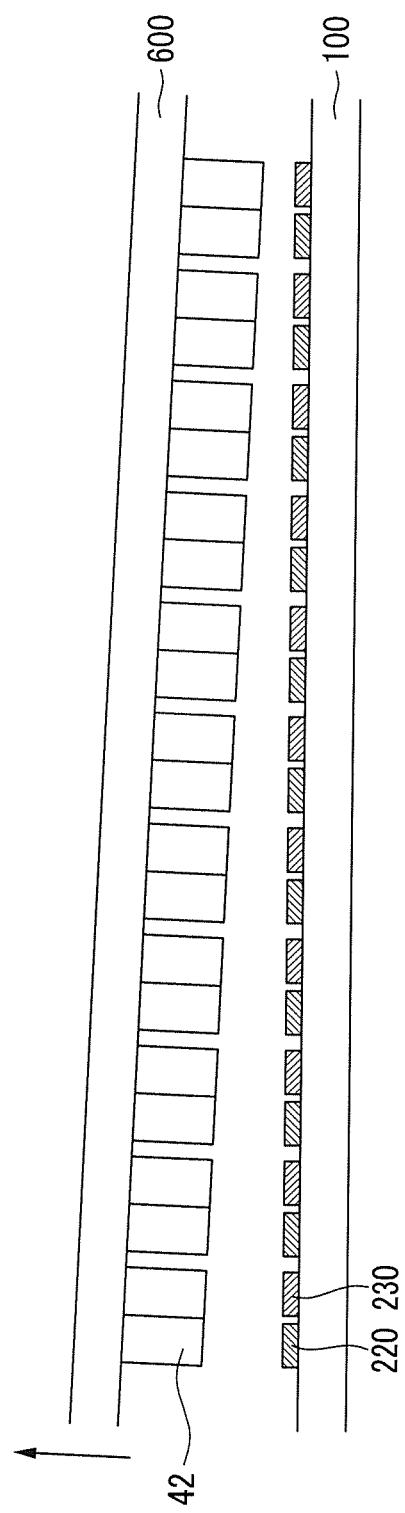
FIG. 18 is a view showing a step of separating the deposition mask from the thin film transistor panel by using an adhering film as a following step of FIG. 17.

FIG. 13 is a perspective view showing a state of spraying organic materials to a deposition mask in a manufacturing method of an organic light emitting diode (OLED) display according to the second exemplary embodiment, FIG. 14 is a view showing a step of spraying the first organic material in a manufacturing method of an organic light emitting diode (OLED) display according to the second exemplary embodiment, FIG. 15 is a view showing a step of spraying the second organic material as a following step of FIG. 14, FIG. 16 is a view showing a step of spraying the third organic material as a following step of FIG. 15, FIG. 17 is a view showing a step of adhering an adhering film to a deposition mask as a following step of FIG. 16, and FIG. 18 is a view showing a step of separating a deposition mask from a thin film transistor panel by using an adhering film as a following step of FIG. 17.

Referring to FIG. 13, in the manufacturing method of the organic light emitting diode (OLED) display according to the second exemplary embodiment, the thin film transistor panel 100 is firstly formed. Also, the deposition mask 400 may be formed by the photolithography process on the thin film transistor panel 100.

The deposition mask 400 includes a plurality of deposition walls 410 for blocking the organic materials 10, 20, and 30 that are sprayed at less than the blocking angle (α). Six deposition walls 410 are connected to each other, thereby forming a hexahedral deposition wall 42 in the hexahedral shape. The deposition wall 410 includes an upper surface 410b, and a first wall 410a and a second wall 410c extending from the upper surface 410b downward.

When the length of the deposition wall 410 is referred to as a, and the blocking angle at which the organic materials 10, 20, and 30 are blocked by the deposition wall 410 is referred to as α, the height h of the deposition wall 410 is defined by Equation 2 as follows.

$$h = a \times \tan \alpha \qquad \text{Equation 2}$$

Next, as shown in FIG. 13 and FIG. 14, the first organic material 10 is obliquely sprayed from the linear deposition source 500 to the deposition mask 400 to form the first color organic emission layer 210 on the thin film transistor panel 100. In this embodiment, the linear deposition source 500 is obliquely positioned such that the blocking angle (α) is formed between the spray direction of the first organic material 10 sprayed from the linear deposition source 500 and the surface of the thin film transistor panel 100.

Referring to FIG. 13 and FIG. 14, the first organic material 10 is sprayed in a first hexahedral direction j1 to form the first color organic emission layer 210 in the hexahedral deposition wall 42. The first color organic emission layer 210 of the rhombus shape is formed in the inner portion of the hexahedral deposition wall 42 that is not blocked by the hexahedral deposition wall 42. The first hexahedral direction j1 is substantially parallel to a direction connecting facing edges of the hexahedral deposition walls 42.

Next, as shown in FIG. 13 and FIG. 15, the second organic material 20 is sprayed in a second hexahedral direction j2 that is 120 degrees from the first hexahedral direction j1, to form the second color organic emission layer 220 of the rhombus shape in the hexahedral deposition wall 42.

Next, as shown in FIG. 13 and FIG. 16, the third organic material 30 is sprayed in a third hexahedral direction j3 that is 120 degrees from the second hexahedral direction j2, to form the third color organic emission layer 230 of the rhombus shape in the hexahedral deposition wall 42.

Next, as shown in FIG. 17, the adhering film 600 is adhered to the upper portion of the deposition mask 400 including the hexahedral deposition walls 42. Next, as shown in FIG. 18, an upward force is applied to detach the adhering film 600, and the deposition mask 400 is concurrently (e.g., simultaneously) separated from the thin film transistor panel 100. This is because the deposition mask 400 is attached to the adhering film 600 by the adhesion of the adhering film 600.

Accordingly, as shown in FIG. 12, the hexahedral pixels (Q) separated from each other are completed.

As described above, the deposition mask is formed by the photolithography process such that the alignment of the deposition mask is straightforward when manufacturing the organic light emitting diode (OLED) display of a large size.

Also, in one embodiment, the organic emission layer is formed by using the deposition mask including the hexahedral deposition wall such that the blue organic emission layer does not overlap the red organic emission layer and the green organic emission layer, thereby improving the visibility and the transmittance.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

| Description of Some Symbols | | | |
|---|---|---|---|
| 100: | thin film transistor panel | 210: | first color organic emission layer |
| 220: | second color organic emission layer | 230: | third color organic emission layer |
| 400: | deposition mask | 410: | deposition wall |
| 500: | linear deposition source | 600: | adhering film |

What is claimed is:

1. A method for manufacturing an organic light emitting diode (OLED) display, the method comprising:
    forming a thin film transistor panel;
    forming a deposition mask on the thin film transistor panel by a photolithography process;
    obliquely spraying an organic material to the deposition mask from a linear deposition source to form an organic emission layer on the thin film transistor panel; and
    removing the deposition mask by using an adhering film,
    wherein the deposition mask comprises a plurality of deposition walls configured to block the organic material sprayed at an angle that is less than a blocking angle.

2. The method of claim 1, wherein
    the plurality of deposition walls comprises a parallel deposition wall comprising two deposition walls that are separated from each other and are substantially parallel to each other.

3. The method of claim 2, wherein
    when a distance between the deposition walls is referred to as Wp, the blocking angle at which the organic material is blocked by the deposition wall is referred to as α, and a deposition length at which the organic material is deposited in the parallel deposition wall is referred to as Wsp, a height h of the deposition wall is defined as follows:

$h=(Wp-Wsp)\times\tan\alpha$.

4. The method of claim 2, wherein
    the forming of the organic emission layer comprises:
    spraying a first organic material in a first direction to form a first color organic emission layer in the parallel deposition wall;
    spraying a second organic material in a second direction that is 180 degrees from the first direction, to form a second color organic emission layer in the parallel deposition wall; and
    spraying a third organic material in a third direction substantially in parallel to a height direction of the deposition wall, to form a third color organic emission layer in the parallel deposition wall.

5. The method of claim 4, wherein
    the second color organic emission layer is separated from the first color organic emission layer.

6. The method of claim 1, wherein
    the plurality of deposition walls comprises a hexahedral deposition wall forming a hexahedral shape of which six deposition walls are connected to each other.

7. The method of claim 6, wherein
    when a length of the deposition wall is referred to as a and the blocking angle at which the organic material is blocked by the deposition wall is referred to as α, the height h of the deposition wall is defined by $h=a\times\tan\alpha$.

8. The method of claim 6, wherein the forming of the organic emission layer comprises:
    spraying a first organic material in a first hexahedral direction to form a first color organic emission layer of a rhombus shape in the hexahedral deposition wall;
    spraying a second organic material in a second hexahedral direction that is 120 degrees from the first hexahedral direction, to form a second color organic emission layer of the rhombus shape in the hexahedral deposition wall; and
    spraying a third organic material in a third hexahedral direction that is 120 degrees from the second hexahedral direction, to form a third color organic emission layer of the rhombus shape in the hexahedral deposition wall.

9. The method of claim 8, wherein
    one direction of the first hexahedral direction, the second hexahedral direction, and the third hexahedral direction is substantially parallel to a direction at which facing edges of the hexahedral deposition wall are connected to each other.

* * * * *